United States Patent [19]

Nichols et al.

[11] 4,424,496

[45] Jan. 3, 1984

[54] DIVIDER/COMBINER AMPLIFIER

[75] Inventors: Lawrence J. Nichols, Burlington; George H. MacMaster, Lexington, both of Mass.

[73] Assignee: Raytheon Company, Lexington, Mass.

[21] Appl. No.: 310,011

[22] Filed: Oct. 13, 1981

[51] Int. Cl.³ .............................................. H03F 3/60
[52] U.S. Cl. ....................................... 330/286; 330/56
[58] Field of Search .................... 330/54, 56, 286, 287

[56] References Cited

U.S. PATENT DOCUMENTS 4,234,854 11/1980 Schellenberg et al. ............. 330/286
4,283,685 8/1981 MacMaster et al. ................ 330/286

Primary Examiner—James B. Mullins
Assistant Examiner—Gene Wan
Attorney, Agent, or Firm—Martin M. Santa; Joseph D. Pannone; Richard M. Sharkanksy

[57] ABSTRACT

A divider/combiner amplifier circuit divides input power through a sectored coaxial line to a plurality of longitudinal parallel channels spaced around the circumference of a cylinder; the power in each channel is amplified by a semiconductor device; and the amplified power is combined in another sectored coaxial line. A microwave waveguide connected to the input and output of each amplifying device confines the microwave energy of the operating mode to the longitudinal channel formed by said waveguide. Each waveguide extends longitudinally along the cylinder and each is circumferentially spaced from its neighboring waveguide by a space which forms a cut-off waveguide to the operating mode. In the event of a failure of one or more amplifying elements, the space allows the failure mode to propagate radially to microwave absorbing material where it is absorbed to prevent reflection back into the longitudinal waveguide and thus effectively isolates the failure to provide a gradual deterioration of the amplifier circuit performance with element failure.

12 Claims, 4 Drawing Figures

DIVIDER/COMBINER AMPLIFIER

BACKGROUND OF THE INVENTION

This invention relates to solid state microwave amplifiers and more particularly to divider/combiner circuits for obtaining higher power output than can be obtained from one solid state amplifier by appropriately combining the output power from more than one amplifier. More particularly, the circumferential divider/combiner circuit of the invention combines the output power of a moderate number of high frequency bipolar and/or field effect transistors to provide high power amplification in the 8–20 GHz frequency band. In this frequency range, power amplification techniques are almost totaly dominated by thermionic-cathode microwave tubes with some limited applications for one-port negative resistance semiconductor devices. The need for higher-power solid state microwave amplifiers exists in order to provide amplifiers of smaller size, lighter weight, increased reliability and lower cost than are presently available.

In the prior art, the semiconductor devices which are available for amplification in the 10 GHz frequency range are limited in the output power that they can provide. Thus, although they have a broad bandwidth and have the advantage of not utilizing thermionic cathodes, their lack of ability to produce high power is a substantial limitation to their application. These active semiconductor devices have been incorporated into prior art circuits to increase their output power by paralleling a number of devices. However, it has been found that paralelling of individual semiconductor devices has disadvantages in reduction of efficiency and the effect of paralleling upon the impedance at the input and the output of the paralleled devices which limits the number of such devices which may be paralleled.

When using more than one amplifier because the required output exceeds the capability of a single device, such as a high frequency transistor, several amplifiers can be connected in parallel. There are disadvantages and dangers in the simple parallel connection. An input VSWR of 1.22, for example, represents a reflection power loss of only 1%. But if two devices both having a VSWR of 1.22 are connected in parallel, the power split between them depends on the impedance ratio which in this case could be as high as 1.5 if the phases of the two reflections were 180° apart. Similar arguments can be made about output impedances. Not only is the power divided unequally, but if one unit fails because of unequal power split or for other reasons, the resulting high VSWR can adversely affect the remaining units.

A problem arises in prior art divider/combiner circuits that utilize integral damping resistors to provide isolation between paralleled solid state amplifiers. These integral damping resistors introduce instability and also reduce efficiency in the operating mode. Although, in the prior art divider/combiner circuits the isolation resistors are connected so that currents should not flow in the operating mode, the distributed reactances within the circuit do produce current flow in the isolation resistors in the operating mode; and, hence, the stability and efficiency of the divider/combiner circuit is reduced.

Although solid state power amplifiers using combined negative resistance diodes are becoming available for use in the 8–20 GHz frequency range, they have inherent problems with noise performance, limited dynamic range, and poor stability which limits their utility. Transistors are presently being developed which operate in this frequency range and have demonstrated 5 watts output with 5 db gain at 8 GHz and ½ watt output with 5 db gain at 20 GHz. Numerous applications are envisioned for solid state microwave amplifiers delivering 10–50 watts output power. Assuming 90 percent combining efficiency can be achieved, a reasonable number of existing transistors do provide the desired output power when combined as in this invention.

SUMMARY OF THE INVENTION

The aforementioned problems are overcome and other advantages are provided by this invention of a circumferential divider/combiner circuit in which the field patterns and electrode geometry are such that no fields of the operating mode reach the isolation resistors. The isolation resistors are effectively out of the circuit unless there is a mismatch at one or more of the amplifier ports at which occasion the resistors are coupled by the resulting fields and thereby prevent the buildup of high Q resonance which could damage the active elements. The isolation resistors are tapered in order to reduce reflection of the energy of the mismatch produced mode by providing a matched load.

The divider/combiner amplifier circuit combines the output power of more than one solid state amplifying device spaced around the circumference of a cylinder. The cylinder has an input port which through a sectored coaxial line divides the incoming energy which is to be amplified into parallel channels, amplifies each channel with a conventional transistor of either the FET or bipolar type, and after amplification combines through a sectored coaxial line the output powers from each transistor which is provided at the output port. The circumferentially spaced channels are formed of longitudinally slotted concentric inner and outer electrically conducting cylinders. Each channel acts as a microwave waveguide which is connected to the input and output of each amplifying device and confines the microwave energy of the operating mode to the longitudinal channel formed by said waveguide. The inner and outer conductors of the waveguide extend radially and also longitudinally along the cylinder and each conductor is circumferentially spaced from its neighboring wall by a space to also form a waveguide in the radial direction which is below cut-off to the operating mode. In the event of a failure of one or more amplifying elements the radial waveguide allows a failure mode to propagate inwardly and outwardly radially to mirowave absorbing material (isolating resistors) where it is absorbed to prevent reflection back into the longitudinal channel and thus effectively isolates the failure to provide a gradual deterioration of the amplifier circuit performance with element failure. The structure also provides the sectored coaxial line impedance matching circuits at the ends of the channels to couple the input power from the input port to the inputs of the channels and to couple the power from the outputs of the channels to the output port.

It is an object of this invention to provide a multiple device structure which can be used to obtain higher output power than for single devices, to provide graceful degradation of system operation with failure of the devices, and to extend the system life by operating each device conservatively. It is a more specific object of this invention to combine the power output of transistors to obtain a higher output power as an alternative to power amplifier tubes typically in the frequency range mentioned above. It is a further object of the invention to provide a structure of small size and weight, and with low production costs. It is a further object of the invention to provide a structure which can be operated with existing high frequency transistors of limited power output. It is a further object of the invention that the structure be a low loss circuit capable of operating in the frequency band of 8–20 GHz with at least 20% bandwidth and having high isolation between the input and output ports.

These and other objects will be apparent from the following description of the invention when considered in conjunction with the accompanying drawings.

BRIEF DESCRIPTION OF THE DRAWINGS

The aforementioned objects and features of the invention are explained in the following description taken in conjunction with the accompanying drawings.

DESCRIPTION OF THE PREFERRED EMBODIMENT

Figure 1:
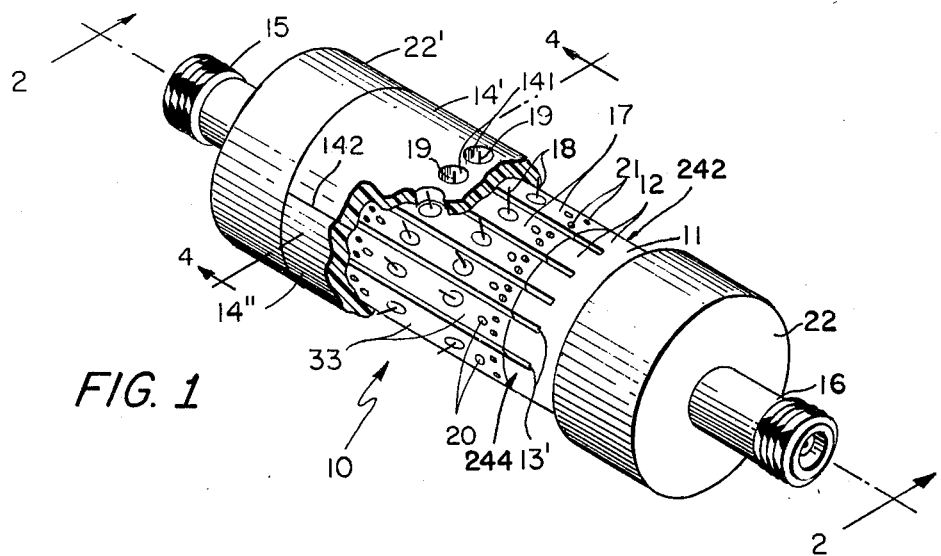
FIG. 1 is a perspective view partially in a cross-section of the structure of the invention showing the multiple channels.

The circumferential divider/combiner circuit 10 of this invention is a new power combining scheme for transistor amplifiers which overcomes the problems associated with insertion loss, bandwidth, and isolation properties that are inherent in other types of power combiner approaches. A key feature of the circumferential divider/combiner approach is the geometrical configuration of the coaxial transformers 241, 242 which are formed by copper steps 240 to keep line losses low and for wide bandwidth. This circumferential design along with the external damping resistors 14 also ensures that there are no overload problems or stability problems of this multiamplifier network that do not already exist for an individual amplifier.

In addition to solving the electrical problems, the power combining approach of this invention provides a superior configuration for cooling transistor amplifiers. For divider/combiner circuits, the power limits are usually set by the ability to control device temperature.

A ten-channel version of the circumferential divider/combiner circuit 10 is shown in the figures. This circuit 10 may be considered as a split 4-step coaxial transformer 241 in the divider circuit followed by a split 4-step coaxial transformer 242 in the combiner circuit. Inner 26 and outer 24 coaxial cylindrical conductors are split into ten sections to provide proper mode and isolation characteristics. The central regions 243, 244 which are divided into ten 50 ohm parallel plane transmission lines 12 are spaced, and 50 ohm amplifiers 17 are inserted in the spaced region. As shown schematically in FIG. 2, the amplifiers 17 are mounted on the outer conductor of the transmission line 33 face inward, providing a superior configuration for cooling. The length of this copper heat sink (transmission line 33) accommodates the matching networks 34, 43 and transistor amplifiers 17. The heat sink 33 on which the transistor amplifier 17 is mounted can be removed by screws 20, 21 and different power amplifiers may be mounted for replacement of defective amplifiers as desired. In addition to transistor amplifiers, transistor devices and impatt diodes may be mounted on the heat sink 33 and connected to the circumferential divider/combiner circuit 10.

The high power handling capabilities of the circumferential divider/combiner circuit 10 should also be noted, along with the electrical features of wide bandwidth, low loss, and high isolation. There are no individual isolation resistors; isolation is achieved by means of inner 32 and outer 14 coaxial loads which can handle very high powers. These loads are effectively out of the circuit unless there is a mismatch at one or more of the transistor ports.

Although a ten-channel version of the circumferential divider/combiner was built and tested, a large number of channels (N) may readily be incorporated. The input coax is split up into N sections. There is continuity of center and outer conductors. If each amplifier operates at an impedance level equal to the coax impedance, the parallel combination represents an impedance mismatch of N to 1. Thus, there is the necessity for the wideband stepped or tapered matching section.

Since the entire structure is symmetrical about the axis 27, it is convenient to use (instead of individual amplifier connections as terminals) a set of symmetry terminals, each mode consisting of a symmetric distribution of voltages around the ring. In such a system the scattering matrix of the circumferential divider is obtained by a matrix transformation which indicates that any symmetric wave pattern excited on the divider (except the desired one) should be absorbed by non-reflecting damping resistors (transmission is impossible by symmetry). If such matched terminations are achieved, the divider performance will be ideal.

The matched terminations provided by resistors 14, 32 imply some sort of stepping or tapering of the resistors. The termination configuration looks like FIG. 2 with resistors inside 32 or outside 14 or both. If resistors are on one side of channels 12 only, the other side can be connected together without the slots 13, 28 to form a "ground" plane. The "ground" plane version of the invention is not shown in the figures since that embodiment is apparent from the preferred embodiment which is considered to provide better performance.

Referring now to FIGS. 1–4 there is shown an amplifier assembly 10 which, in accordance with the invention, comprises a cylindrical structure 11 which contains a plurality of channels 12 for the amplification of the microwave energy. The channels 12 are separated by air gap slots 13 which confine the electromagnetic energy in each channel 12. The outer portion of the channels 12 and the slots 13 are enclosed with a hollow cylinder of microwave energy absorbing material 14, typically a carbon-loaded epoxy. The input terminal 15 of the amplifier assembly 10 is at one end of the cylinder 11 while the output terminal 16 is at the other end of assembly 10. Also shown in FIG. 1 are the amplifier subassemblies 17 with terminals 18 and 19 through which power is provided to the amplifier element of the amplifier subassembly 17. The amplifier subassemblies 17 are fastened into their respective channels 12 by pressure contact produced by screws 20, 21. Conventional electrical connectors (not shown) connected to a power source provide the appropriate power to terminals 18, 19 of the transistor 46 of amplifier subassembly 17. The cylindrical absorber 14 is assembled from two semi-cylinders 14′, 14″ abutting along line 142 and having holes 141 sufficiently large to clear the leads 18 and 19 when being placed over the amplifier assemblies 17 and cylinder 11. Typically, there may be ten amplifier assemblies 17 uniformly distributed around the circumference of the cylinder 11.

Figure 2:
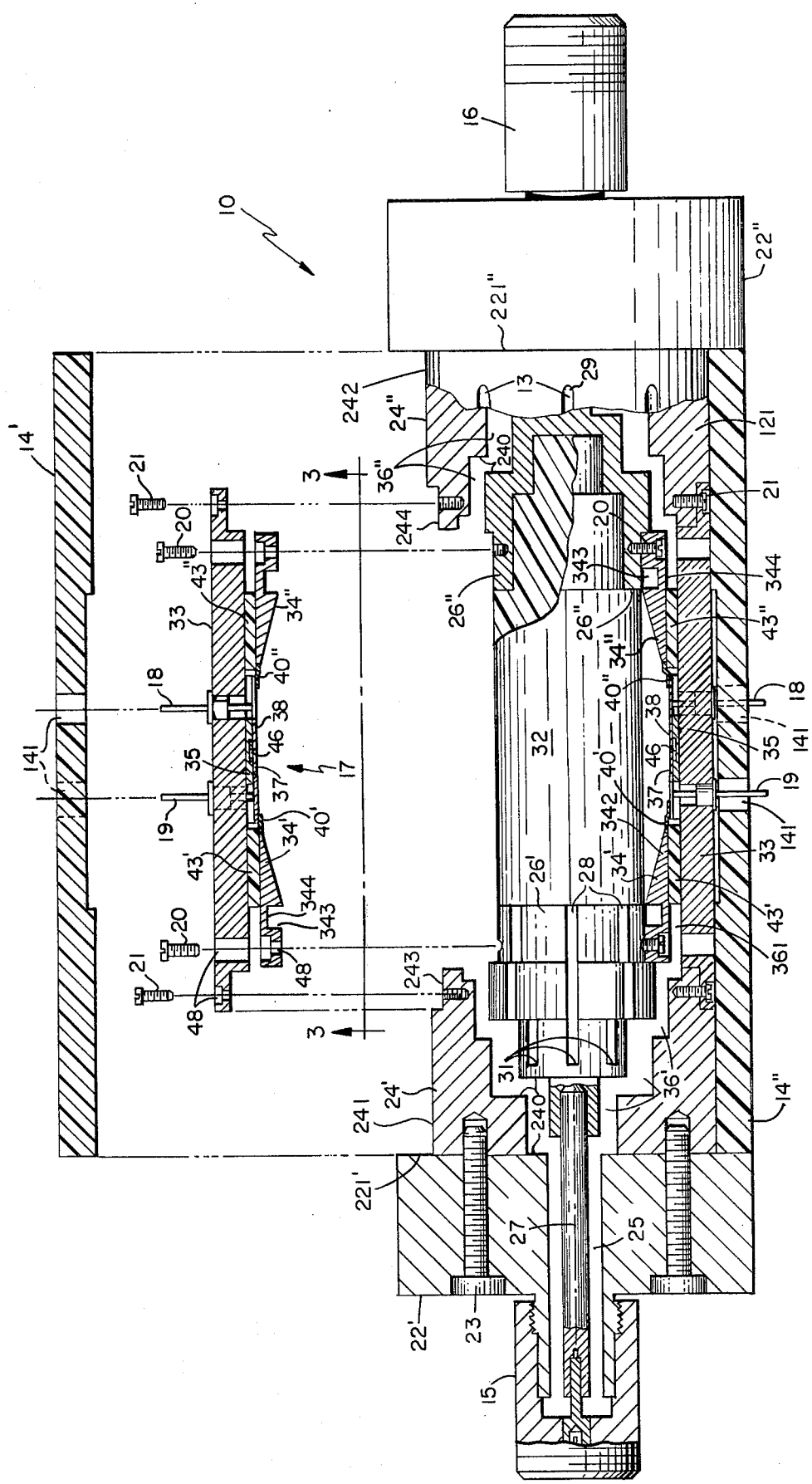
FIG. 2 is a graphical cross-sectional view of the invention with an exploded view portion.

Referring now to FIG. 2 there is shown in isometric view of the amplifier circuit 10, partially in cross-section and partially in exploded view. The microwave input connector 15 is attached to a cylindrical block 22′ which is attached to the cylindrical structure 24′ by screws 23. Cylindrical structure 24′ has radial slots 13 which extend longitudinally in the direction of axis 27. The slots 13 in the cylindrical structure 24′ begin a short distance 29 from the interface 221 of the cylinders 22, 24 and isolate the channels 12. The cylinder 24′ is electrically connected through cylindrical block 22′ to the outer conductor of the connector 15. The inner conductor 25 of connector 15 extends longitudinally inwardly toward the center of the amplifier assembly 10 where it makes electrical contact with a stepped cylindrical electrical conductor 26′ coaxial with the axis 27 of the amplifier assembly 10. The interior stepped conductor 26′ has slots 28 which correspond to and are radially aligned with the slots 13 of the stepped outer conductor 24. The portions of the inner and outer stepped conductors 24′, 26′ between their respective slots 13, 28 comprise a stepped coaxial waveguide for the confinement in space 36′ of the electromagnetic energy which enters at connector 15. The locations 29, 31 of the beginning of the slots 13, 28, respectively, determine where in the stepped coaxial line 36′ the input microwave energy starts being divided into separate channels 12. Slots 28 of the interior stepped cylindrical conductor 26 begin at a location 31 closer to the longitudinal center of the assembly 10 than do the slots 13 and extend radially toward the centered axis 27 of the assembly 10. Beginning slots 28 and 13 at different axial locations provides a gradual transition from the unslotted coaxial line 25 near the interface 221′ to the channels 12 and thereby reduces impedance mismatch in this transition region. The radii and longitudinal lengths of the steps of the stepped conductors 24, 26 are chosen to provide a broad band impedance match between the impedance of the coaxial line 25 at the input and output terminals 15, 16 of the input and output lines 37, 38 connected to the emitter and base, respectively, of the transistor amplifier element 46. The base of transistor 46 being connected to conductor 33.

Located in the interior of the stepped conductors 26′, 26″ and extending longitudinally between the conductors 26′, 26″ is a matching stepped cylindrical microwave absorber 32, typically carbon-loaded epoxy, which absorbs microwave energy which leaks through the slots 28 of the stepped inner conductor 26.

The outer stepped conductors 24 are attached to the end blocks 22 by means of fastener screws 23. The input end 24′ and the output end 24″ of outer stepped conductors 24 are connected to input and output connectors 15, 16, respectively, as illustrated in the amplifier assembly 10 shown in FIG. 2. The amplifier subassemblies 17 are fastened by screws 20, 21 to the inner and outer stepped conductors 26, 24, respectively, the assembly forming the channels 12.

Figure 3:
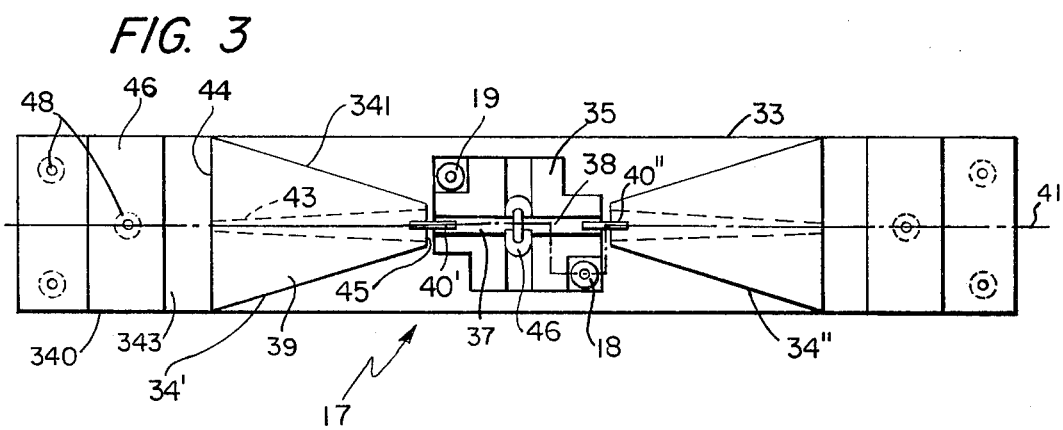
FIG. 3 shows the transistor and transistor mount for each channel of the structure of the invention.

Amplifier subassembly 17 is seen in FIGS. 2, 3 to comprise an outer conductor 33 which is in electrical contact with stepped conductor 24. Subassembly 17 also has inner conductors 34′, 34″ to which the input and output terminals, respectively, of transistor 46 are in electrical contact. Conductors 33, 34 are of the same width as the channel 12 conductors 24, 26, respectively. Because of the symmetry of the amplifier assembly 10 the combiner portion of the assembly 10 connected to output terminal 16 is substantially identical to the divider portion of assembly 10 which is connected to the input terminal 15.

Figure 4:
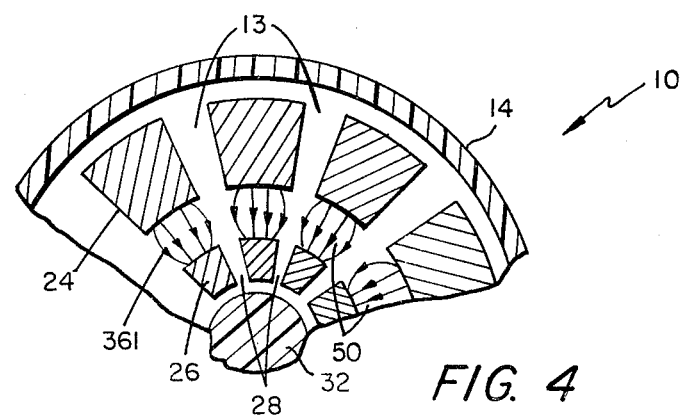
FIG. 4 shows a partial cross-sectional view at section 4—4 of FIG. 1.

The bottom portion of FIG. 2 shows the completed amplifier assembly 10 in cross-sectional view, the incoming electrical signal at electrical connector 15 passes into the impedance-matching stepped coaxial waveguide region 36′ where the signal is divided between channels 12 formed by the slots 13, 28 between conductors 24′, 26′, respectively. The signal in each channel 12 is transmitted along the channel space 361 between channels 12 and the ceramic 43′ bonded to the inner and outer conductors 34, 33. A cross-sectional view at section lines 4—4 of the divider/combiner 10 is shown in FIG. 4 where the electric field lines 50 of the operating mode (TEM) are shown as concentrated in the space 361 between radially separated inner and outer conductors 24, 26 of each channel 12. The radial spaces 13, 28 between conductors 24, 26, respectively, form the waveguides below cutoff which isolate the operating mode field from the absorbers 14, 32, respectively. At least 30 db isolation is desired and the width and radial extent of the spaces 13, 28 are chosen to provide at least that amount of isolation by the reactive attenuation of the cut-off waveguide. The conductors 24 also serve the purpose of thermal conductors of heat produced by the transistor 46 to the end masses 22′, 22″ where the heat is dissipated. The modes, produced when a transistor fails, propagate through the spaces 13, 28 and are dissipated in absorbers 14, 32, respectively. The microwave energy enters enters the input terminal of a commercially available high-frequency FET transistor 46 which comprises a microstrip line 37 formed on a metallic 35. The microwave energy is amplified in transistor 46 whose output is provided on microstrip line 38 where it is propagated into the ceramic separator 43″ from which the amplified signal passes through the channel spaces 36″ of the stepped coaxial line conductors 24″, 26″ to the coaxial region in the vicinity of boundary 221″ where the output signal from each of the transistors is combined before exiting at the output connector 16.

A plan view of the amplifier subassembly 17 is shown in FIG. 3 which illustrates in more detail its construction for confinement of the high frequency energy to the regions desired and for minimizing impedance mismatch. Conductor 33 of subassembly 17 has a constant width and forms a continuation of the outermost portion of a channel 12. The inner conductor 34 which is of constant width near its end 340 tapers inwardly to the center line 41 of the subassembly 17. Typically, the tapered section 341 tapers from 0.3 inches to a width of 0.1 inches which is still substantially wider than the input microstrip line 37 of the transistor 46. Conductor 34 also is tapered radially at region 342, its thickness decreasing at the end nearest transistor 46 as shown in FIG. 2 in order to reduce the length of its attached conductive spring 40 which bridges the gap between conductors 34 and 37 and makes spring contact with the conductor 37. The space between the tapered region 341 and the outer conductor 33 has a tapered ceramic material 43 which is symmetric about the center line 41.

The width of the ceramic material 43 is narrow in the region 44 where the taper 341 of conductor 34 begins, and the width linearly increases in the axial direction to the end 45 of conductor 34 where the ceramic 43 width is substantially equal to the width of microstrip conductor 37. The combination of the tapered conductor 341 and the inversely tapered ceramic 43 causes the energy which has been distributed over the entire region 46 between conductors 33 and 34 to become concentrated in the ceramic 43 between these same conductors at the end 45 of conductor 341 while minimizing any impedance discontinuity. The higher dielectric constant of the ceramic 43 relative to the surrounding air resulting in the concentration of the energy within the ceramic. The width of the ceramic 43 in the region 44 is narrow in order to introduce the ceramic between the conductors 33 and 34 with a minimum of impedance mismatch. Typically the width dimension of the ceramic 43 in the region 44 is only 0.01 inches whereas its width at the other end 45 of the tapered section 341 is increased to 0.05 inches which is substantially the width of the mirostrip conductors 37, 38 which make electrical connection with the input and output terminals, respectively, of the transistor 46. The base of transistor 46 is electrically and thermally connected to the ground plane provided by conductor 33. The emitter and collector of transistor 46 are connected to the power terminals 18 and 19 to which external connection is made to power supplies. The transistor mounting base 35 is a thermally conducting ceramic on which the conductors 37 and 38 are formed to provide in combination with the ground plane 33 a microstrip transmission line. The transistor is typically a commercially available high frequency FET transistor. A bipolar transistor is also suitable. The conductors 33 and 34 of the subassembly 17 are in electrical contact with stepped channel conductors 24, 26, respectively, by pressure contact provided by screws 20, 21 in holes 48. The slot 343 in conductor 34 leaves a portion 344 of conductor 34 which is relatively flexible without affecting the electrical preparations so that the screw 20 may be tightened without breaking the subassembly 17.

A stepped cylindrical body 32 fills the space within the stepped electrical conductor 26 and the region bounded by the subassemblies 17. The cylindrical 32, typically a carbon-loaded epoxy or a lossy ceramic such as titanate, acts as a microwave absorber which absorbs any energy which escapes the channels 12 through the slots 28 of conductor 26 or which extend from the transistor subassembly 17. Also, microwave absorbing semi-cylinders 14' and 14", also typically of the same material as absorber 32, completely surround the exterior of subassemblies 17 and stepped cylinders 24', 24" and act as microwave absorbers to energy which escapes or fringes the slots 13 between the channels 12. The resistivity of the microwave absorbers 14, 32 may be tapered to prevent lower resistivity in the immediate vicinity of the slots 13, 28 in order to minimize reflection of the microwave energy of the undesired modes whose energy passes through the slots 13, 28. The resistivity may also be tapered in the direction of axis 27 in accordance with the field pattern in the axial direction of the undesired mode.

In summary, it is seen that the input energy is first divided into a plurality of separate channels in a slotted stepped transmission line 361 into an RF impedance transition region 39 where the RF energy is concentrated into a small region for introduction on microstrip lines 37, 38 and out of the transistor 46. The power output from the individual transistors is combined through similar microwave lines to be provided at the output connector 16.

The circumferential divider/combiner device 10 is designed to avoid the reflection difficulties produced by a failed transistor 46 by effectively isolating one unit from another. The scattering matrix for the circumferential N-way divider or combiner is:

$$S = \begin{vmatrix} 0 & . & . & 1/N & 1/N & 1/N \\ . & . & . & . & . & . \\ . & . & . & . & . & . \\ 1/N & . & . & 0 & 0 & 0 \\ 1/N & . & . & 0 & 0 & 0 \\ 1/N & . & . & 0 & 0 & 0 \end{vmatrix}$$

where terminal pair 1 is the external terminal and the other N terminal pairs connect to the individual units. If all terminals are terminated in matched units, the power splits equally. Any reflected power resulting from mismatch of a unit does not reach any other unit directly, but only via reflection of 1/Nth of the reflected power off the source mismatch. To achieve the zeros in the scattering matrix, which represent complete decoupling among the elements, all other modes on the circumferential divider/combiner circuit except the operating mode, see a match looking away from the amplifier units. For this purpose, the isolation elements are tapered. These isolation elements consist of cylindrical damping resistors at absorbers 14, 32 which are isolated from the operating mode.

The circumferential divider/combiner device 10 has the geometry shown in FIG. 4. It has rotational symmetry. When all units are identical, the voltage on all segments is identical by symmetry.

A unique difference between the amplifier device of this invention and prior art is that applicants' device has a means of isolating the stabilizing damping loads 14, 32 so that device will operate at higher efficiency than devices constructed using prior art where dissipative elements were provided by a plurality of isolation resistors connected between adjacent sectors where parasitic capacitances caused dissipation in the isolation resistors even in the operating mode.

Measured data for the ten-channel circumferential divider/combiner circuit 10 showed that the bandwidth was 70% and the combiner 241/divider 242 loss was 0.2 dB. This means that the more significant quantity, the equivalent loss for one combiner alone, is about 0.1 dB. The measurements showed that the inner and outer external damping resistors did not introduce any loss in the desired mode. Additional data on the ten-channel circumferential divider/combiner 10 showed a low VSWR over 1½ octaves passband from 4.0 to 12.0 GHZ.

Having described a preferred embodiment of this invention, it will now be apparent to one of skill in the art that other embodiments incorporating this invention may be used. It is felt, therefore, that this invention should not be restricted to the disclosed embodiment but rather should be limited only by the spirit and scope of the appended claims.

What is claimed is:

1. A microwave amplifier comprising:
    a first waveguide means;
    an amplifying means connected to said first waveguide means to form a waveguide amplifier having an input and an output;

a plurality of said waveguide amplifiers having their inputs and outputs connected in parallel;

means adjacent said first waveguide providing a second waveguide between each pair of adjacent first waveguides of said waveguide amplifiers which prevents the operating mode of each of said waveguide amplifiers from propagating through said second waveguide means;

a microwave absorber terminating each second waveguide; and said absorber absorbing the microwave energy transmitted through said second waveguide from said first waveguide means.

2. The amplifier of claim 1 wherein:

said first waveguide means comprises first and second conductors separated in a first direction by a first mirowave propagation space;

said first and second conductors of each of said adjacent waveguide amplifiers being spaced from each other, respectively, in a second direction transverse to said first direction to form said second waveguide means, said second waveguide means formed by adjacent said first conductors and formed by adjacent said second conductors providing isolation between said first waveguide means and said absorber and acting as a reactive attenuating waveguide beyond cutoff to the operating mode of said first waveguide means and as a transmissive waveguide between said absorber and said first waveguide means of other modes of said first waveguide means.

3. The amplifier of claim 1 comprising in addition:

an input means;

an output means;

means for equally dividing microwave power applied to said input means between said waveguide amplifiers; and means for combining the output power of each of said waveguide amplifiers and providing said combined power to said output means.

4. The amplifier of claim 3 wherein said means for dividing the input microwave power and combining the output power each comprises a radially stepped impedance transforming coaxial line having spced inner and outer coaxial conductors; and said inner and outer conductors having a plurality of slots in the direction of the length of said coaxial line, said inner and outer conductor slots being in radial alignment, said spaced slotted inner and outer conductors being a part of said first waveguide means.

5. The amplifier of claim 4 comprising:

said amplifying means comprising a microwave transmission line comprising first and second radially spaced conductors having the same width as the greatest width of said slotted inner and outer coaxial conductors, respectively;

said first and second radially spaced conductors being adapted to be attached at each end to the inner and outer conductors, respectively, of said input dividing means and said output combining means;

a plurality of amplifying elements; and said first conductor being interrupted and adapted to be serially connected at said interruption to the input and output terminals of said amplifying means.

6. A microwave amplifier comprising:

a plurality of parallel first microwave waveguides, each first waveguide comprising a pair of conductors separated by a microwave propagation space;

a plurality of microwave amplifier elements;

each first waveguide having an input end and an output end and having one of said amplifier elements connected thereto to amplify microwave energy applied to the output end of the first waveguide;

each of said first waveguides being connected in parallel so that a signal applied to the input end of said parallel connection is amplified in each first waveguide and combined at the output connection of said first waveguides;

each conductor of a pair of conductors spaced to form said first waveguide being laterally spaced from the corresponding conductor of an adjacent first waveguide to provide slots extending along and between said adjacent conductors;

corresponding spaced adjacent conductors forming second and third waveguides, said second and third waveguides each being a reactively attenuating cutoff waveguide to the operating mode and frequency at which amplification takes place in the first waveguide;

said second and third waveguides having microwave absorbers disposed at the slot ends most remote from said microwave propagation space of said first waveguide, said absorbers acting as a termination for said second and third waveguides for microwave energy propagating in said second and third waveguides.

7. The microwave amplifier of claim 6 wherein each of said conductors of said pair of conductors forming each of said first waveguides has a thickness in the direction transverse to said microwave propagation space of said first waveguide, said thickness being sufficient to cause said conductors to provide said second and third waveguides in said thickness direction.

8. A divider/combiner amplifier circuit comprising:

a cylindrical array of a plurality of microwave transmission lines extending longitudinally along the surface of said cylindrical array and circumferentially spaced from each other along said surfaces;

each of said transmission lines comprising a pair of longitudinally extending radially spaced inner and outer electrical conductors;

a plurality of amplifier elements, each connected to one of said transmission lines to amplify microwave energy entering one end of said transmission line and exiting at the other end of said transmission line;

a first and second coaxial line each having inner and outer concentric conductors;

each said coaxial line at one end having a larger diameter of both inner and outer conductors than at the other end, said larger diameter conductors being connected to the ends of said transmission line and being longitudinally slotted to correspond to the circumferential spacing and width of the conductors of said transmission lines;

the other end of said coaxial line being of smaller diameter and unslotted;

microwave absorbers at the radial ends of the circumferential spaces between the inner and outer conductors of said transmission line and said larger diameter coaxial line; and said circumferential spaces and the radial thickness of said conductor and said larger diameter coaxial line providing waveguides beyond cutoff for attenuating the operating mode of the transmission lines and a propagation space for modes other than the operating mode to cause said microwave absorbers to resistively terminate said waveguide beyond cutoff.

9. The amplifier of claim 8 comprising:

each said coaxial line having a plurality of inner and outer concentric coaxial conductor diameters intermediate those at its ends to provide a stepped coaxial transmission line.

10. The amplifier of claim 9 wherein one of said microwave absorbers comprises a hollow cylindrical absorber whose inner radius is greater than and which surrounds the spaced outer conductors of the array of the plurality of spaced microwave transmission lines and said slotted coaxial lines; and the other of said microwave absorber comprises a stepped cylindrical absorber whose diameter is less than that of and which is surrounded by the spaced inner conductors of the array of the plurality of spaced microwave transmission lines and said slotted coaxial lines.

11. The amplifier of claim 10 wherein said microwave absorbers have a resistivity which is less in the immediate vicinity of said slots than at farther removed positions within the absorber to provide a tapered resistor having small reflections of microwve energy incident upon it through said slots.

12. A microwave amplifier comprising:

means for amplifying microwave energy comprising a radially spaced pair of conductors forming a microwave transmission line in the region between said conductors;

means for providing an amplifier element within said transmission line for amplifying microwave energy passing down said line;

a plurality of said transmission lines and corresponding amplifier elements extending longitudinally and spaced from each other along the circumference of a cylinder to form slots spaced along said circumference which extend longitudinally;

a microwave energy absorber at each radial end of said slots; and said pair of transmission line conductors, each extending radially a sufficient distance and spaced sufficiently closely to form a radially directed transmission line which is beyond cutoff at the operating mode frequency and which allows transmission to said absorbers for modes other than the operating mode.

* * * * *